United States Patent [19]
Okamura

[11] Patent Number: 5,883,588
[45] Date of Patent: Mar. 16, 1999

[54] DATA COMPRESSION SYSTEM AND DATA COMPRESSION DEVICE FOR IMPROVING DATA COMPRESSION RATE AND CODING SPEED

[75] Inventor: Toshihiko Okamura, Tokyo, Japan

[73] Assignee: NEC Corporation, Tokyo, Japan

[21] Appl. No.: 538,652

[22] Filed: Oct. 4, 1995

[30] Foreign Application Priority Data

Oct. 4, 1994 [JP] Japan .................................. 6-239926
May 19, 1995 [JP] Japan .................................. 7-121135

[51] Int. Cl.$^6$ ...................................................... H03M 7/30
[52] U.S. Cl. ......................................................... 341/51
[58] Field of Search ................................. 341/51, 67, 106

[56] References Cited

U.S. PATENT DOCUMENTS

| | | | |
|---|---|---|---|
| 4,906,991 | 3/1990 | Flala et al. ................................. | 341/51 |
| 5,003,307 | 3/1991 | Whiting et al. ............................ | 341/51 |
| 5,016,009 | 5/1991 | Whiting et al. ............................ | 341/67 |
| 5,126,739 | 6/1992 | Whiting et al. ............................ | 341/106 |
| 5,142,282 | 8/1992 | Tobin et al. ................................ | 341/55 |
| 5,243,341 | 9/1993 | Seroussi et al. ........................... | 341/51 |
| 5,379,036 | 1/1995 | Storer ......................................... | 341/51 |
| 5,525,982 | 6/1996 | Cheng et al. .............................. | 341/51 |

FOREIGN PATENT DOCUMENTS 3-68219  3/1991  Japan .

OTHER PUBLICATIONS

Bell, "Better OPM/L Text Compression", IEEE Transactions on Comm., vol. 34, No. 12, 1986 pp. 1176–1182.

*Primary Examiner*—Howard L. Williams
*Attorney, Agent, or Firm*—Foley & Lardner

[57] ABSTRACT

A data compression system includes a data array storage device, a coding device, a retrieving and recording device and a recording controller. The data array storage device stores both the input data to be compressed and the input data coded by the coding device. The recording controller determines the character strings recorded by the retrieving and recording device by discriminating between character strings on the basis of the length of the matched character strings beginning from an intermediate character of the matched character strings. The coding device then codes the matched character strings using the length and position of the recorded character strings.

15 Claims, 8 Drawing Sheets

DATA COMPRESSION SYSTEM AND DATA COMPRESSION DEVICE FOR IMPROVING DATA COMPRESSION RATE AND CODING SPEED

BACKGROUND OF THE INVENTION

1. Field of the Invention

The present invention relates generally to a data compression system and a data compression device which can restore a compressed data without distortion. More specifically, the invention relates to a data compression system and a data compression device which can improve coding speed by registering a character string in a retrieving means for retrieving a historical data array.

2. Description of the Related Art

As a data compression method for storing a large size data in a storage means in a reduced data size, a text replacing type distortionless data compression system, known as Ziv and Lempel system has been widely used since later 1980's. Amongst, a data compression algorithm called as LZ77 type is frequently employed as a file compression tool for a high compression rate.

The LZ77 type data compression method is characterized by a historical data array for storing input data for which coding is completed. The historical data array is frequently used in a circular ring like manner for facilitating updating. Namely, in the historical data array, a predetermined length of region, called as a lookahead region, is provided to store the data to be compressed. Then, according to progress of compression, the lookahead region is shifted in circular ring manner.

In the LZ77 type data compression method, at first, a data to be compressed (data in the lookahead region) and a character string beginning from a portion other than the lookahead region in the historical data array, namely the character string beginning from an entry storing the input data for which compression has already been completed are checked to retrieve a character string, on which a match is established. If sufficiently long matched character string can be found, the position of the leading end of the matched character string in the historical data array and a length thereof is fed as a codeword of the matched character string in the lookahead region.

Here, by making the value of the length of the matched character string to be checked or so forth variable as required for variable coding, compression efficiency can be further improved. By uniting the leading position of the matched character string to the most recent one and expressing the leading position of the matched character string at the relative distance to the leading end of the lookahead region, relatively small value can be used, and improvement of the compression rate by variable length coding can be promoted. The historical data array is updated so that most recent coded data can be stored.

Namely, the LZ77 type data compression system takes the most recently coded data as "dictionary" and the character strings to be registered in the dictionary are all of the character strings to be shorter than or equal to a predetermined length starting from the entry storing the data already compressed in the historical data array. This means that number of the character strings registered in the dictionary is greater than that in LZ78 compression method which is another form of Ziv and Lempel system. Accordingly, it makes it easier to find out longer matched character string to achieve higher compression rate.

As a measure in the case where sufficiently long matched character string cannot be found, there is an algorithm called as LZSS type method. The LZSS type data compression system employs two coding modes. One is a copy mode to be used when a sufficiently long matched character string (normally, more than or equal to 3 symbols in the case where one symbol is 1 byte), and the other is a literal mode to be used when the sufficiently long character string cannot be found.

In order to discriminate the copy mode and the literal mode, mutually distinct codeword are used for respective modes. In case of the copy mode, the codeword is consisted of a bit string indicative of the matching length and a bit string indicative of the matching position. In case of the literal mode, the leading one character of the character string to be compressed is used as the code word as is. For discrimination between the literal mode and the copy mode, a measure is taken to provide one bit of flag or to newly generate a greater alphabetic character by combining the matching length and the alphabetic character of the input data.

When LZ77 type data compression is performed, it is important to perform comparison of the input character string to be compressed and the character strings in the historical data array at high speed. As shown in FIG. 6, a retrieving portion 62 is provided for performing retrieval of character string by means of certain retrieving means with respect to the historical data array stored in a historical data array storage portion 61, and all of the character strings in the historical data array have to be registered in the retrieving portion 62. Currently, in view of the fact that, in addition to retrieval in the historical data array in parallel by means of a dedicated hardware, the historical data array is sequentially updated, a retrieving means utilizing tree structure, such as a binary tree, trie and so forth or a retrieving means having a linear list upon collision in a hash table may be employed. These retrieving means performs retrieval using a pointer indicative of the position of the leading end of the character string in the historical data array. Namely, these retrieving means read the character strings in the historical data array on the basis of the pointer indicative of the leading position of the character string and compare with the character string as the target.

One example of the data compression technology having the retrieving means employing the binary tree has been disclosed in "IEEE Transactions on Communications" (Vol. 34, No. 12, 1986, P. 1176–1182). On the other hand, another example of the data compression technology having the retrieving means employing the trie structure has been disclosed in U.S. Pat. No. 4,906,991, for "Textual Substitution Data Compression with Finite Length Search Windows". On the other hand, one example of the data compression technology having the retrieving means employing the hash table and the linear list has been disclosed in Japanese Unexamined Patent Publication (Kokai) No. Heisei 3-68219, for "Data Compression Apparatus and Method".

FIG. 7 is an illustration showing a condition of the historical data array stored in the historical data array storage portion 62. FIGS. 8, 9 and 10 show construction for respective retrieving means at the condition of the historical data array as illustrated in FIG. 7. FIG. 8 shows the retrieving means employed by the binary tree, FIG. 9 shows the retrieving means employing by the trie, and FIG. 10 shows the retrieving means having the linear list for collision in the hash table. The character strings overflown from the historical data array is required to be deleted from the retrieving means, the retrieving method has to be low in the cost for deletion.

In the LZ77 type data compression system, when the long matched character string can be found, higher compression rate can be achieved. Accordingly, if matching can be established on greater number of character strings, higher likelihood can be achieved to find longer matched character string to improve compression rate. For this purpose, the size N of the historical data array and the maximum length L of the matched character string are made greater. However, by making the size N of the historical data array and the maximum length L of the matched character greater, three problems arise.

First of all, increasing the size N of the historical data array and the maximum length of the matched character string inherently cause increase the number of bits required for expressing the position and length of the character string to possibly low compression rate. However, this problem may be solved in certain extent by variable length coding of the position and length of the character string. Assuming one symbol is 1 byte (8 bits), under the premise that the position and the length of the character string is coded by the fixed length coding, it is said to be optimal to have the historical data array length of approximately 8192 and the maximum length L of the matched character string of approximately 64. However, by employing the variable length coding, the best compression rate is attained at the historical data array length N of 32768,65536 and the maximum length L of the matched character string of 256 to 1024. Therefore, it can be adapted to much greater value.

Secondly, increasing of the size N of the historical data array and the maximum length L of the matched character string should results in greater amount of memory consumption upon coding. However, if the size N of the historical data array and the maximum length L of the matched character string are in the extent of N=65536 and L=2048, it merely requires only about 2 Mbytes of memory including the retrieving means. Therefore, it can be executed without causing any problems in the currently available workstation or the high performance personal computer.

Thirdly, increasing of the size N of the historical data array and the maximum length L of the matched character string significantly lower coding speed. One indicia for estimating the coding speed in the LZ77 type coding is number of times of comparison of the characters. Assuming the data length is M, the number of times of comparison of characters in the binary tree, trie, the hash table with the linear list may be approximated as follows:

No special retrieving means is provided . . . M'LN

Retrieving means of binary tree is employed . . . ML $\log_2$ N

Retrieving means of trie is employed . . . ML

Retrieving means of hash table is employed . . . M'LN'

In the LZ77 type data compression, the data is divided into a plurality of partial character strings. Then, the codeword corresponded to each partial character string. In the foregoing formulae, M' represents the number of the partial character strings. On the other hand, N' represents an average length of the linear list.

In case of retrieval employing the binary tree or the trie structure, retrieving is required to register the character string at an appropriate position of the retrieving means. Therefore, it becomes necessary to retrieve the character strings having lengths shorter than or equal to the predetermined length from all of the positions in the data by the retrieving means.

In contrast to this, in case of the retrieving means employing the hash table, retrieval of the character string is only required for the character strings beginning from the leading end of the character string to be coded. Registration of character string beginning from the intermediate portion of the matched character string can be performed by calculation of a hash function and re-writing of one record in the hash table. Therefore, retrieval of the character string is not required. Thus, in the method employing the hash table, the number of times of comparison of the character strings is expressed not by the data length M but as a multiple of the partial character string M'. The average linear list length N' may become equal to the length N of the historical data array in the maximum length. Unless sufficiently large number of hash table are provided, it cannot be made smaller. On the other hand, allowing slight lowering of the compression rate, the length N' of the average linear list can be cut off at appropriate number of times to permit making the constant smaller.

Thus, when a difference between the number M' of the partial character strings and the data length M becomes large, higher speed process can be expected for the retrieving means employing the hash table, in which the number of times of comparison of the character strings is proportional to the number M' of the partial character strings in comparison with the retrieving means employing the binary tree or trie. Particularly, in case of the data having large redundancy, since the difference between the data length M and the number M' of the partial character string becomes large, significant difference may be caused in the execution period between the retrieving means employing the hash table and the retrieving means employing the binary tree or the trie. Setting that the length N of historical data array at 65536 and the maximum length L of the matched character string at 1024, the substantial degradation in the coding speed is inherently caused in the retrieving means employing the binary tree or the trie. Therefore, in such case, data compression is not practically possible unless hash table is employed.

However, even by the retrieving means employing the hash table, when the longest matched character string is to be obtained, the average linear list length N' becomes large, Therefore, number of comparison of the character strings required for one retrieval cycle may become unacceptably large. In that case, data compression efficiency becomes comparable to the case where the no special retrieving means is provided and thus can lower execution speed.

One method for speeding up retrieving process for the character string in the case that the tree structure is employed in the retrieving means, has been disclosed in the above-identified U.S. Pat. No. 4,906,991. In the above-identified U.S. patent, there is disclosed a technology for registering only character strings beginning from the leading end of the character string to be coded in the retrieving means which employs the trie structure. However, if only the character strings beginning from the leading end of the character string to be coded, sufficient compression rate should not be achieved.

SUMMARY OF THE INVENTION

It is therefore an object of the present invention to provide a data compression system which can effectively reduce number of character strings to be compared and to be registered in a retrieving means even when large historical data array is employed and can improve data compression rate and coding speed, simultaneously.

According to the first aspect of the invention, a data compression system comprises:

historical data array storage means having a plurality of entries for storing input data and for storing coded input data;

retrieving and recording means for performing retrieval of matched character strings through comparison of the input data to be compressed and the coded input data stored in said historical data array storage means and recording character strings in said historical data array storage means;

recording control means for selecting said character strings in said historical data array storage means to be recorded in said retrieving and recording means; and coding means for performing coding of said matched character strings in the input data to be compressed by using the length of said matched character strings and the position of said matched character strings included in said recorded character strings in said retrieving and recording means.

In the preferred construction, the recording control means discriminates each of said character strings beginning from the intermediate characters of said matched character strings in said input data to be compressed between the character strings to be recorded in said retrieving and recording means and the character strings not to be recorded on the basis of the length of said matched character strings. The recording control means may record the character strings beginning from the leading end of the matched character strings in the input data and the character strings beginning from the intermediate position of the matched character strings having length smaller than or equal to the predetermined threshold valve, in said retrieving and recording means. The threshold value may be varied dynamically depending upon necessity.

In the alternative, the recording control means may record each of said character strings beginning from the intermediate characters of said matched character strings in said input data to be compressed between the character strings to be recorded in said retrieving and recording means and the character strings not to be recorded on the basis of the position of the leading end of the matched character string in the coded input data in the historical data array storage means. Then the recording control means may record the character strings beginning from the leading end of the matched character strings in the input data and the character strings beginning from the intermediate positions of the matched character strings which has relative distance between the position of the leading end of said matched character string in the coded input data and position of the leading end of the input data to be compressed being greater than or equal to the threshold value, in said retrieving and recording means.

In a preferred embodiment, the data compression system may further comprise index data array storage means having entries corresponding to respective entries in said historical data array storage means, said index data array storage means assigning index for the leading entry of the character string to be recorded in said retrieving and recording means among entries of said historical data array storage means, maintaining said index at the position of said index data array storage means corresponding to said entry in said historical data array storage means, and generating a position code indicative of the position of said entry in said historical data array storage means on the basis of said index.

According to the second aspect of the invention, a data compression system comprises:

historical data array storage means having a plurality of entries for storing input data and for storing coded input data;

retrieving and recording means for performing retrieval of matched character strings through comparison of the input data to be compressed and the coded input data stored in said historical data array storage means and recording character strings in historical data array storage means;

recording control means for selectively recording character strings beginning from positions in a range between the leading end of said matched character strings stored in said historical data array storage means and a given digit represented by a threshold value from the leading end of said matched character strings in said retrieving and recording means; and coding means for performing coding of said matched character storings in the input data to be compressed by using the length of said matched character strings and the position of said matched character strings included in said recorded character strings in said retrieving and recording means.

Other objects, features and advantages of the present invention will become clear from detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

Figure 1:
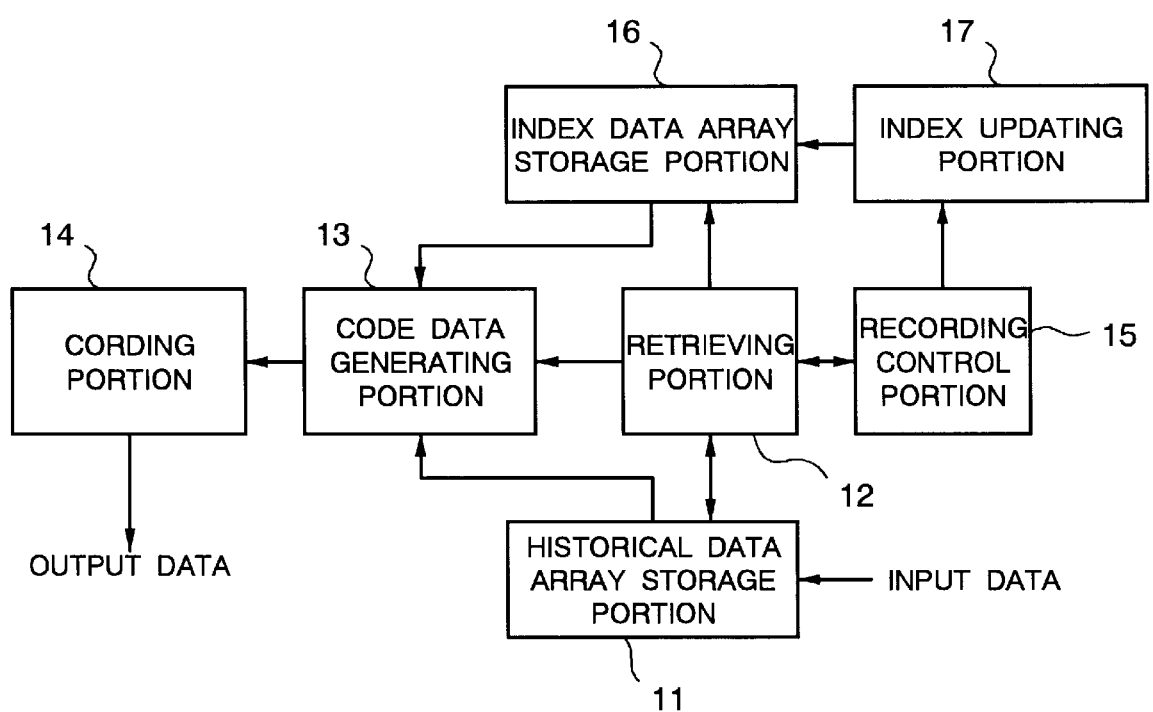
FIG. 1 is a block diagram showing a construction of the first embodiment of a data compression system according to the present invention.

The present invention will be discussed hereinafter in detail in terms of the preferred embodiments of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

At first, a data compression system according to the present invention will be briefly outlined in order to facilitate clear understanding of the present invention.

A data compression method and the data compression system according to the present invention are based on the premise that character strings in a historical data array are registered or recorded in a retrieving means for the character string. By controlling register or recording of the character strings, number of the character strings to be compared and the number of character strings to be recorded in the retrieving means can be reduced. Also, when a large historical data array is provided in order to achieve higher compression rate, it is frequently caused that the same character strings appear frequently to be a cause of lowering of the coding speed. The present invention solves this problem in the following manner.

The character string to be compressed is compared with the character string in the historical data array for establishing matching to find a matched character string. When the character string is coded in this way, retrieval is inherently performed. Thus, utilizing the result of retrieval, the character string can be easily inserted in the retrieving means. Accordingly, it should be reasonable to record or register the character string which is begun from the leading position of the coded character string in the retrieving means. When the matched character string is found, further improvement can be attained by recording the character string beginning at the intermediate position of the matched character string in the retrieving means. Therefore, in the present invention, a recording control means for recording the character string beginning from the leading position of the matched character string and the character string beginning at the intermediate position of the matched character string but satisfying a predetermined condition, is provided.

A criterion for judgement whether recording by the recording control means to the retrieving means should be recognizable upon restoration of the compressed data. Thus, the criterion can be based on the information, such as the length of the matched character string or the position of the matched character string. Then, by avoiding recording of the character string beginning from the intermediate position, it is expected that no substantial influence for the compression rate may be caused. With taking the matching length of the character string as the criterion, with respect to the data having high redundancy to appear frequently, wasteful recording to the retrieving means can be significantly reduced. Thus, in comparison with the conventional system, in which all of the character strings beginning from the historical data array are recorded, significant improvement of the coding speed can be achieved.

On the other hand, on the basis of the position of the matched character string in the historical data array, the judgement whether the character string beginning from the intermediate position of the coded character string, can be made in the following manner. Namely, when the matched character string has appeared in the process ahead of the current process over a given processing cycles or more, the character string in question is overflown from the historical data array shortly. Even in this case, in order to make it possible to make reference to the character string including the character string in question, the character string beginning from the intermediate position of the coded character string is recorded in the retrieving means. Conversely, when the matched character string is identified in the relatively recent process, the character string in question will be maintained in the historical data array for a relatively long period. Therefore, even if such character string beginning from the intermediate position of the coded character string in the retrieving means, the compression rate is expected to be significantly lowered by neglecting of recording as set forth above. Thus, with taking the position of the matched character string in the historical data array, in the data having high redundancy, the longest matched character string can be found in relatively close position. Therefore, number of the character string to be recorded in the retrieving means can be reduced to achieve improvement in the coding speed.

On the other hand, it is possible to simply record all of the character strings beginning from the positions of the leading end to a leading given number of characters corresponding to the threshold value of the matched character string. However, if the threshold value is greater than the matched character string, all of the matched character strings at any positions have to be recorded. In this meaning, this method can be regarded to be determined by the character strings recorded on the basis of the matching length. In this case, when the threshold value is set smaller, number of the character strings to be recorded becomes smaller to improve the coding speed.

In the present invention, since the character strings beginning from all positions in the historical data array cannot always be made reference to, if the leading position of the matched character strings are directly expressed by the position in the historical data array, it becomes redundant. Therefore, by providing index only for necessary positions, and by using a difference between the index of the leading position of the matched character strings and the most recent index, the position of the character string is expressed by the relative distance to the position of the historical data array. By this, the position of the character string can be expressed by the small value and thus the bit length of the codeword expressing the position can be made smaller. In this case, by employing the index data array, the indexes corresponding to respective entries have to be held.

Next, the preferred embodiment of the data compression system according to the present invention will be discussed with reference to the accompanying drawings.

FIG. 1 is an illustration showing a construction of the first embodiment of the data compression system according to the present invention.

As shown, the shown embodiment of the data compression system includes a historical data array storage portion 11 storing the historical data array having a plurality of entries for storing the input data, a retrieving portion 12 for effectively performing retrieval of the character strings in the historical data array storage portion 11, a recording control portion 15, an index data array storage portion 16, an index updating portion 17 supplying the index, a coded data generating portion 13 for performing coding of the character strings and a coding portion 14.

The historical data array storage portion 11 stores the historical data array as the character strings after coding. In addition, the historical data array storage portion 11 certainly obtain a lookahead region and sequentially store the character strings to be coded in the lookahead region.

The retrieving portion 12 retrieves the character strings in the historical data array storage portion 11 and record and hold the predetermined character strings under control of the recording control portion 15.

The recording control portion 15 controls recording of the character string in the historical data array storage portion 11 to the retrieving portion 12 through a predetermined procedure. The procedure for controlling recording of the character string to the retrieving portion 12 will be discussed later.

The index data array storage portion 16 assigns a index for predetermined entry among the character strings recorded in the retrieving portion 12 and maintains the assigned indexes.

The index updating portion 17 supplies the index to the index data array storage portion 16.

The coded data generating portion 13 and the coding portion 14 are similar to the historical data array storage means, the coding data generating means and the coding means in the conventional data compression system. The character string retrieved from the historical data array storage portion 11 is replaced with the compressed code and output as a compressed data.

Figure 2:
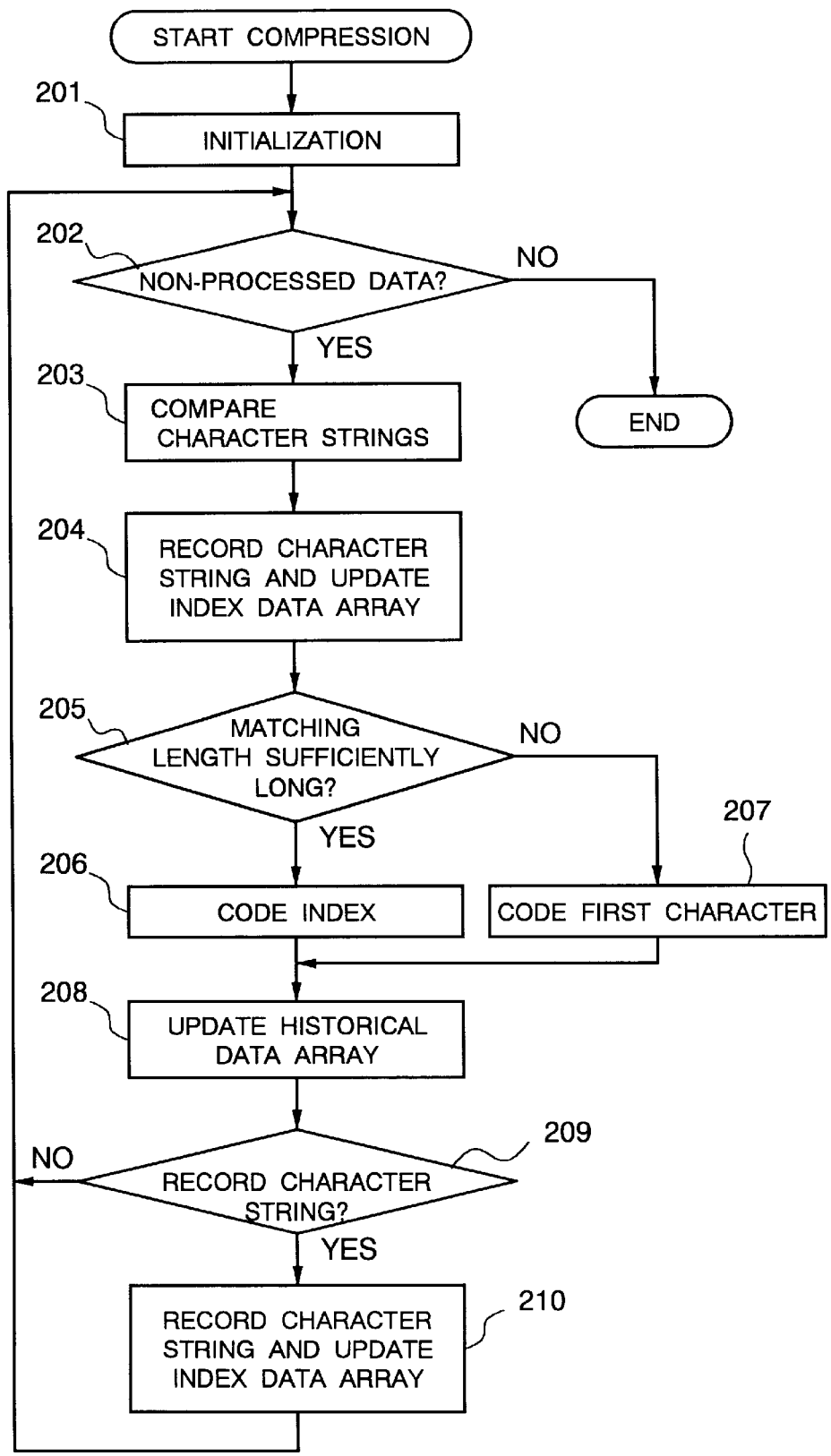
FIG. 2 is a flowchart showing operation of the first embodiment of the data compression system of the invention.

Next, discussion will be given for the operation of the shown embodiment of the data compression system with reference to the flowchart of FIG. 2.

It is assumed that input data are X=x(0), x(1), x(2), .... The historical data array storage portion 11 is assumed to store the input data of N symbol. Assuming one symbol is one byte (8 bits), N=32768 or 65536 may be appropriate. While the number of symbol N may be an arbitrary value, for using the historical data array in a circular ring manner, it generally takes a power of two. On the other hand, the maximum length L of the matched character string is assumed to be greater than or equal to 256. The lookahead region in the historical data array storage portion 11 is set at a size greater than or equal to the maximum length of the matched character strings. In the shown embodiment, the size of the lookahead region is assumed to be L.

At first, the historical data array storage portion 11, the retrieving portion 12, the index data array storage portion 16 and the index updating portion 17 are initialized (step 201).

In the initial state, the historical data array storage portion 11 may be empty or may contain appropriate default character strings. Namely, the initial state of the historical data array storage portion 11 may be any state which can be reproduced upon restoration. The initial states of the retrieving portion 12, the index data array storage portion 16 and the index updating portion 17 are determined adapting to the initial state of the historical data array storage portion 11.

Here, the subsequent operation will be discussed as performing coding of the character strings x(s), x(s+1) after completion of coding of . . . x(s−2), x(s−1).

At this time, in respective entry in the historical data array storage portion 11, the character strings of x(s−N+L), . . . , x(s−1), x(s), . . . x(s+L−1) are stored. In particular, in the lookahead region, the character strings of x(s), . . . x(s+L−1) are stored. The character strings recorded in the retrieving portion 12 are part of character strings beginning from the limited range of positions and having length shorter than or equal to L. In the entry of the index data array storage portion 16 corresponding to the leading position of the character strings recorded in the retrieving portion 12, the corresponding indexes are maintained.

Since there are not yet processed data, comparison of the character strings are performed (steps 202, 203). Namely, by using the retrieving portion 12, comparison of the character strings x(s), x(s+1), . . . and the character strings recorded in the retrieving portion 12 is performed to obtain the longest matched character strings. It should be noted that since the process to obtain the longest matched character string takes a long period, if higher processing speed is desired to be obtained even with slightly sacrificing the compression rate, possible longest matched character string rather than the longest matched character string may be obtained.

Since the results of retrieval are known with respect to the character strings x(s), x(s+1), . . . , the results are recorded in the retrieving portion 12 (step 204). In the entry where the x(s) is stored, the index to be supplied to the index updating portion 17 is assigned. The assigned index is maintained in the index data array storage portion 16. The index updating portion 17 updates the value of index by "1" when ever the index is supplied by the index data array storage portion 16 (step 204). Since the index is required to make respective entry to be distinguished, by expressing a remainder with respect to the number N of the symbol, it can be expressed with 0 to N−1.

Next, by checking the length of the matched character string, the manner of coding is determined (steps 205, 206, 207). When the longest matched character strings are x(s−N+L+k), . . . x(s−N+L+k+j−1)=x(s), . . . x(s+j−1), the retrieving portion 12 feeds the matching length j to the coded data generating portion 13. When matching length j is greater than or equal to preliminarily determined constant value M, the coded data generating portion 13 feeds out the matching length j, the index held in the entry corresponding to the entry corresponding to the position of x(s−N+L+k) and a difference of the index held in the entry corresponding to x(s) together with the flag indicative that the matched character string has been found (steps 205 and 206). This coding is coding in the copy mode.

On the other hand, when the matching length j is smaller than the given value M, with setting j=1, the coded data generating portion 13 feeds x(s) as is, together with the flag indicative that the matched character string is not found (steps 205 and 207). This coding is the coding in the literal mode.

The coding portion 14 converts the values, such as j, d, x(s) and so forth into final binary strings (steps 206 and 207). As the coding portion 14, in addition to that of the fixed length, the coding portions employing huffman coding, arithmetic coding and so forth may be employed. The coding portion 14 may perform coding whenever the data is input, and in the alternative, by accumulating the data in the buffer, coding may be processed per block.

At a timing completing coding of the character strings x(s), . . . x(s+j−1), the state of the historical data array storage portion 11 is updated. Namely, by reading new input data, the lookahead region is shifted to the region beginning from the entry of x(s+j). At this time, the old character string deleted from the historical data array storage portion 11 is also deleted from the retrieving portion 12 (step 208).

The recording control portion 15 makes judgement whether the character string to be recorded in the retrieving portion 12 is present among the character strings starting from x(s+1), . . . x(s+j−1). For example, in case of the character string coded in the literal mode, judgement is made that no character string to be recorded is present to proceed the process for the next character string (step 209). On the other hand, the character string selected for recording is recorded in the retrieving portion 12. Then, numbers supplied from the index updating portion 17 are assigned in the order of entry of the leading positions, respective. Then, the assigned indexes are held in the index data array storage portion 16 (step 210).

As set forth above, the coding for the partial character strings x(s), . . . x(s+j−1) of the input data is completed. Then, new symbol is inserted in the historical data array storage portion 11, and coding for the character string beginning from x(s+j) is initiated.

In the recording control to the retrieving portion 12 by the recording control portion 15, when judgement whether the character string in question is to be recorded or not on the basis of the matching length, it is reasonable not to record when the matching length is greater than a threshold value. The threshold value is preferred to be in a range from approximately 8 to 16 to have good results in experiments. When the threshold value is varied dynamically, a method to take an average value of the past matching length as the threshold value.

Figure 3:
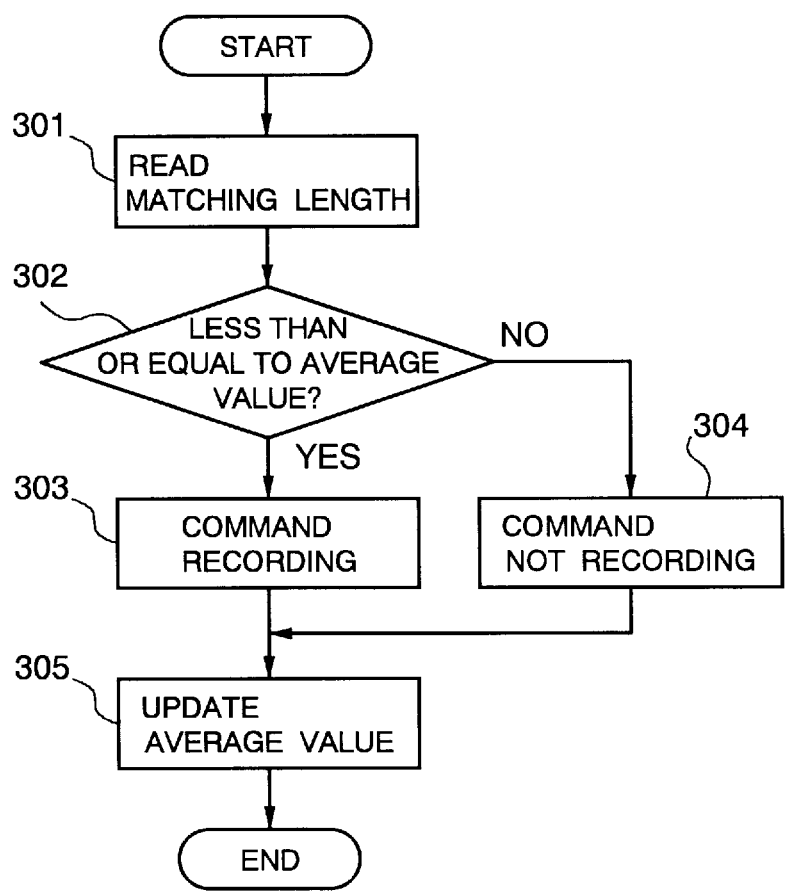
FIG. 3 is a flowchart showing a process for dynamically modifying a threshold value of a matching length of a character string.

FIG. 3 is a flowchart showing a process of the recording control portion 15 in the case where the threshold value is dynamically varied with employing the average value.

At first, upon retrieval of the matched character string, the matching length of the character string is read out (step 301). Then, if the matching length of the character string is shorter than or equal to the average value of the matching length, recording of the character strings beginning from the intermediate position is commanded (steps 302 and 303). On the other hand, when the matching length of the character string is longer than or equal to the average value of the matching length, command is issued so as not to make recording for the character strings beginning from the intermediate portion (steps 302 and 304). After these command, the average length of the matching length is updated (step 305).

On the other hand, in the recording control by the recording control portion 15 in the retrieving portion 12, when determination whether the character string is to be recorded or not, is made on the basis of the beginning point of the matched character string, it is reasonable not to record the character string when the initial point of the matching character string is smaller than the threshold value. The method for dynamically varying the threshold value, variation method of the threshold value when recording control is performed on the basis of the matching character string may be a method for using the average value similarly to the foregoing method.

Next, discussion will be given for the second embodiment of the data compression system according the present invention.

The construction of the shown embodiment is similar to the first embodiment of the data compression system of FIG. 1, in construction.

Figure 4:
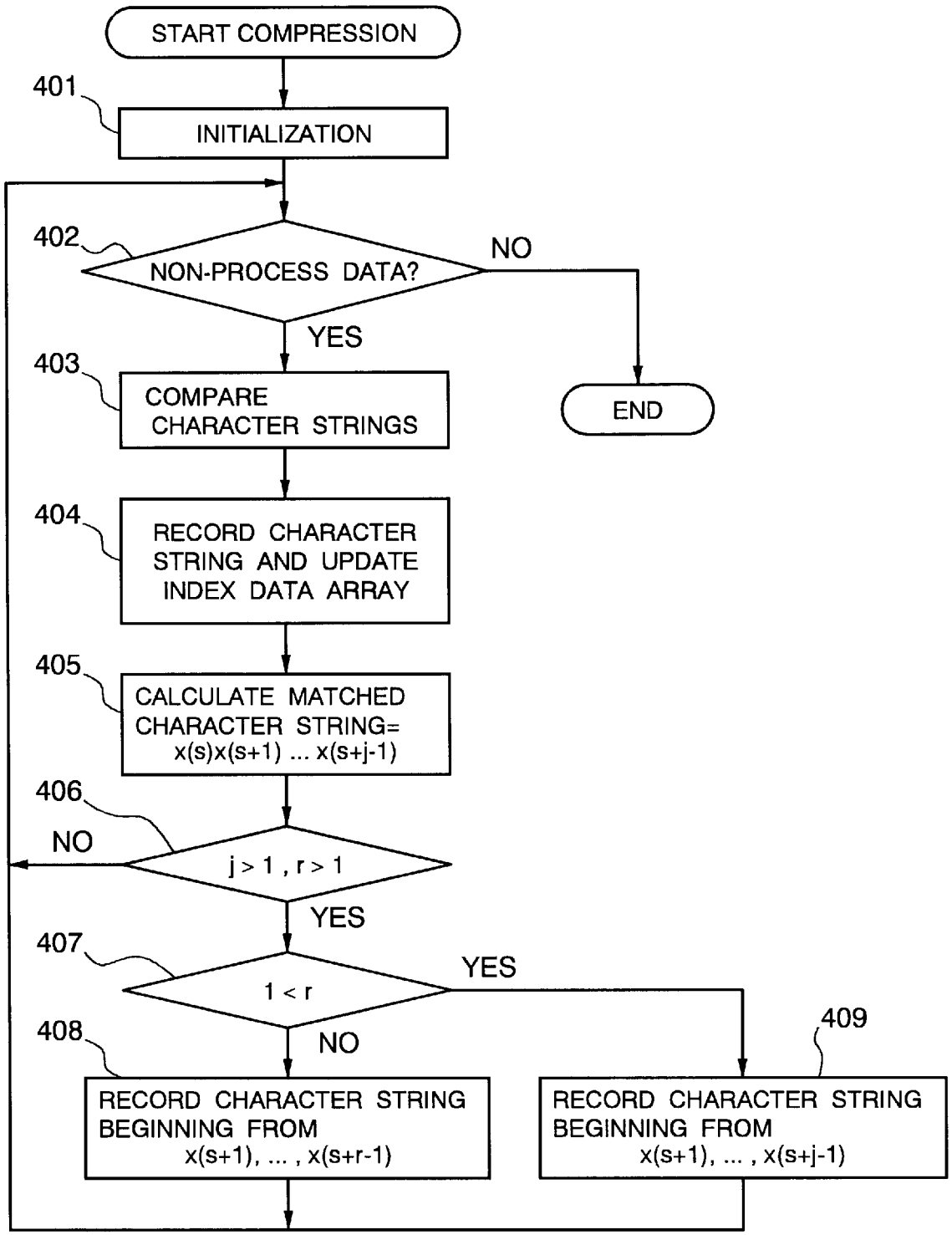
FIG. 4 is a flowchart showing the second embodiment of the data compression system according to the present invention.

The operation of the second embodiment of the data compression system will be discussed with reference to the flowchart of FIG. 4. It should be noted that the operation through the steps 401 to 404 are similar to the operation in the steps 201 to 204 in the former embodiment. Therefore, discussion for these steps will be neglected to avoid redundancy in disclosure and to keep the disclosure simple enough for facilitating clear understanding of the present invention.

The character strings beginning from the leading end x(s) are already recorded by employing the results of retrieval for coding through the process set forth above (steps 401 to 404).

Now, the subsequent discussion will be given based on assumption that the matched character string are x(s), . . . x(t) (matching length j=t−s+1) (step 405).

When the character string is coded by the literal mode (when j=1), or when the threshold value r=1, only character strings beginning from the leading end x(s) are recorded in the retrieving portion 12, there is not record for the character string beginning from the intermediate position of the matched character string (step 406).

When the character strings are not coded by the literal mode, among the character strings extracted as the matched character strings, only character strings beginning from the leading r in number of positions are recorded in the retrieving portion 12. Namely, as the character strings beginning from the intermediate position of x(s), . . . x(t) (j=t−s+1), only character strings beginning from x(s+1), . . . , x(s+j−1) are recorded in the retrieving portion 12 (steps 407 and 408). It should be noted that when 1<r, the character strings beginning from x(s+1), . . . , x(s+j−1) (=x(t)) are recorded (steps 407 and 409).

In the shown embodiment, adjustment can be made to give importance for the coding speed or the compression ratio by modifying setting of the threshold value r. In this case, by setting the threshold value at the leading end of the compression data, the threshold value can be known upon restoring the compressed data into the original condition. Once the threshold value is known, it can be correctly appreciated the position of the historical data array, at which the character strings recorded begin to permit accurate restoration.

Furthermore, when the threshold value r is set to be greater than or equal to 2, improvement of the compression rate can be achieved. Namely, when r≧2, the character string beginning from x(s+1) next to the leading character x(s) of the character string for coding is required to be recorded in the retrieving portion 12. Accordingly, when the tree structure is employed in the retrieving portion 12, it becomes necessary to obtain matched character strings with respect to the character strings beginning from x(s+1) in the process of recording to the retrieving portion. Then, in comparison of the matched character strings from x(s) and the matched character strings from x(s+1), when the number of the matched character string from x(s+1) is greater, x(s) is coded in literal mode, and the matched character strings from x(s+1) are coded in copy mode. Thus, for the character string to be coded by twice of copy mode coding, it is often possible to perform coding by one time of literal mode coding and one time of copy mode coding. Since literal mode can be expressed by smaller number of bits than the copy mode, compression rate can be improved. The foregoing process will be discussed with reference to the flowchart in FIG. 5.

The following discussion will be given with assumption that the matched character strings beginning from x(s) are x(s), . . . , x(s+j−1) (j is matching length) (step 501).

When j is not sufficiently large, x(s) is coded in literal mode (step 502 and 503). Then, the historical data array storage portion 11 is updated and the character strings overflown from the historical data array storage portion 11 are deleted from the retrieving portion 12 (step 508). Then, process is transferred to coding of the character strings beginning from x(s+1) (step 513).

When j is sufficiently large, the longest matched character string between the character string beginning from the character x(s+1) next to the leading character and the character strings in the historical data array storage portion 11 are obtained, by employing the results of retrieval, the character string beginning from x(s+1) is recorded in the retrieving portion 12 (step 504). The matched character string is set at x(s+1), . . . x(s+j') (j' is matching length). Comparing the matching length j and the matching length j', if j' is greater, x(s) is coded by the literal mode and x(s+1), . . . x(s+j') is coded by the copy mode (steps 505 and 506). Next, corresponding to the size of the coded character string, i. e. number of characters of (1+j'), the historical data array storage portion 11 is updated. Then, the character strings overflow from the historical data array storage portion 11 are deleted from the retrieving portion 12 (step 509). Next, with respect to the character strings beginning from x(s+1), . . . x(s+j'), recording in the retrieving portion 12 is performed through the recording process as illustrated in FIG. 4 (step 511). Then, the process is transferred to coding of the character strings beginning from x(s+j'+1) (step 514).

On the other hand, when the matching length j is greater than or equal to the matching length j', x(s), . . . x(s+j−1) are coded by the copy mode (steps 505 and 507). Next, for the side of the coded character string, namely for one character, the historical data array storage portion 11 is updated. Then, the character strings overflow from the historical data array storage portion 11 are deleted from the retrieving portion 12 (step 510). Then, with respect to the character strings beginning from x(s), . . . x(s+j−1), recording to the retrieving portion 12 is performed through the recording process illustrated in FIG. 4 (step 512). At this time, recording for the character strings beginning from x(s+1) has already been completed. Thereafter, the process is proceeded to coding of the character strings beginning from x(s+j) (step 515).

Next, a practical example of the compression process of 2 Mbytes of C program source by employing the binary tree as the retrieving means, with assumption that the length N of the historical data array to be stored in the historical data array storage portion 11 is 16384 and the maximum length L of the matched character string is 256, will be discussed. In the shown example, no retrieving means is provided.

Figure 5:
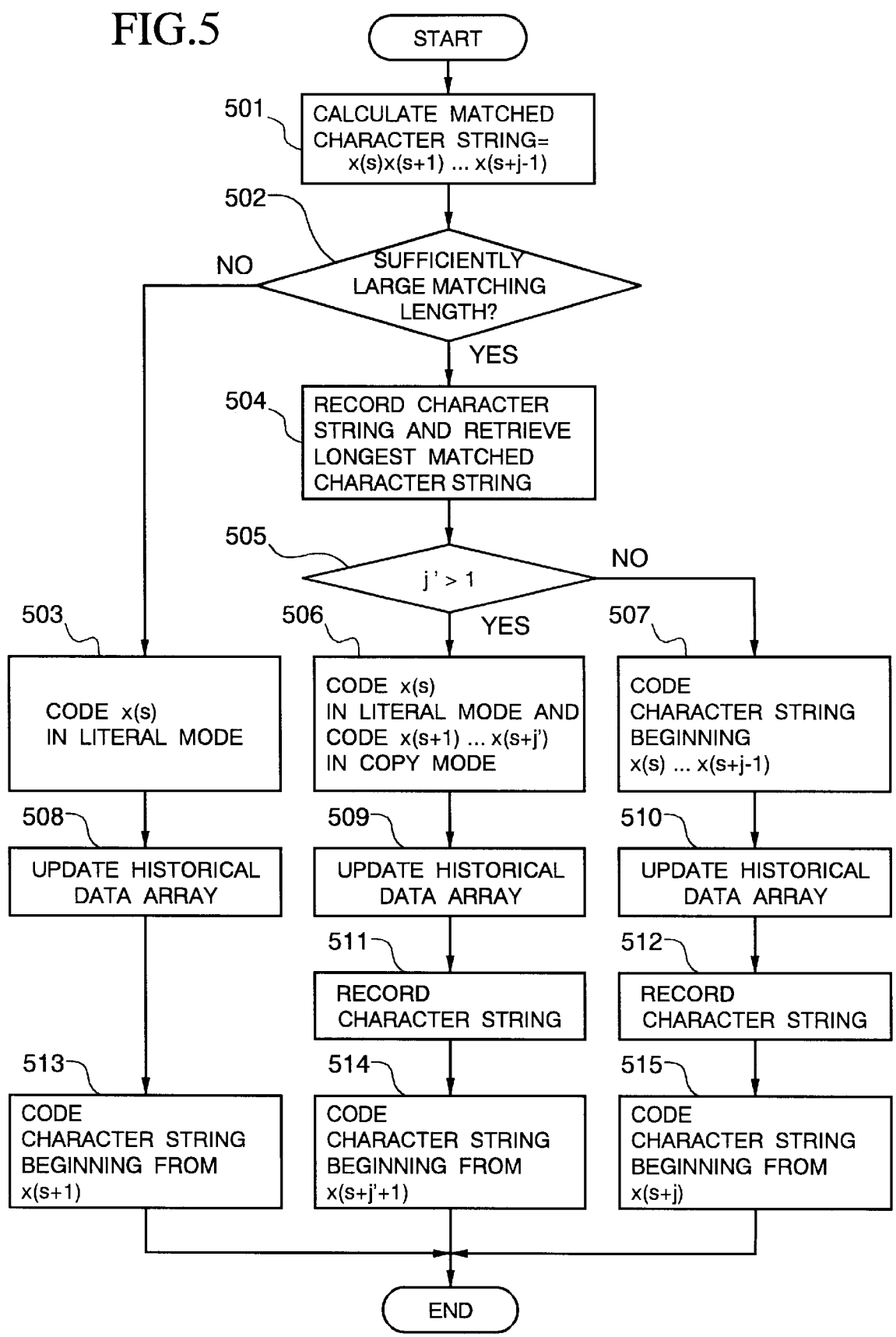
FIG. 5 is a flowchart showing processes for registration control and coding process in the case where a threshold value is set greater than or equal to 2.
Figure 6:
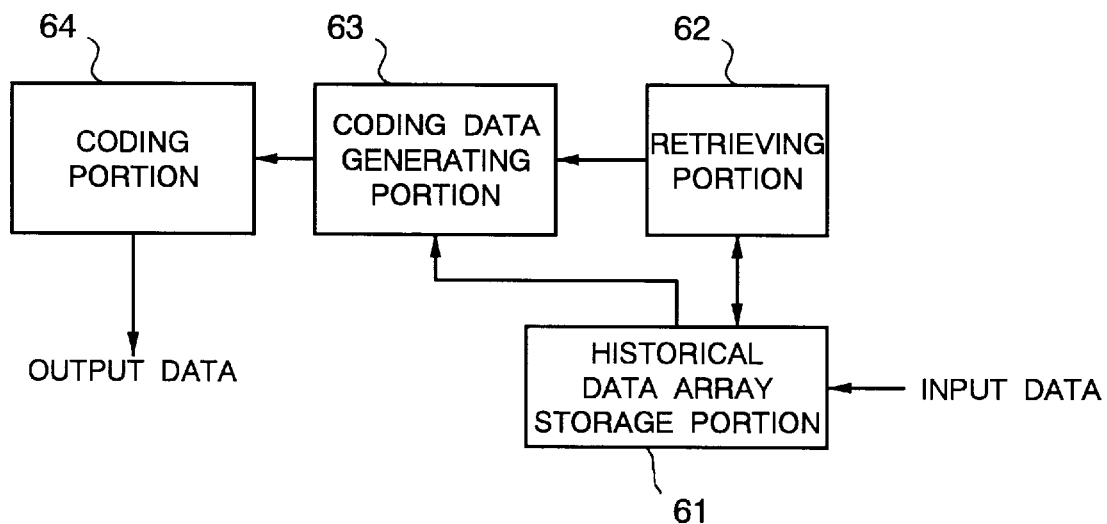
FIG. 6 is a block diagram showing a construction of the conventional data compression system.
Figure 7:
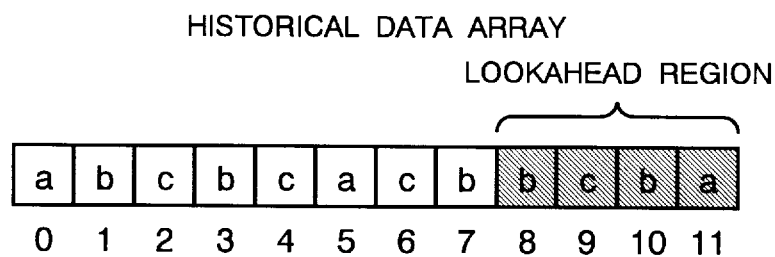
FIG. 7 is an illustration showing one example of a condition of a historical data array.
Figure 8:
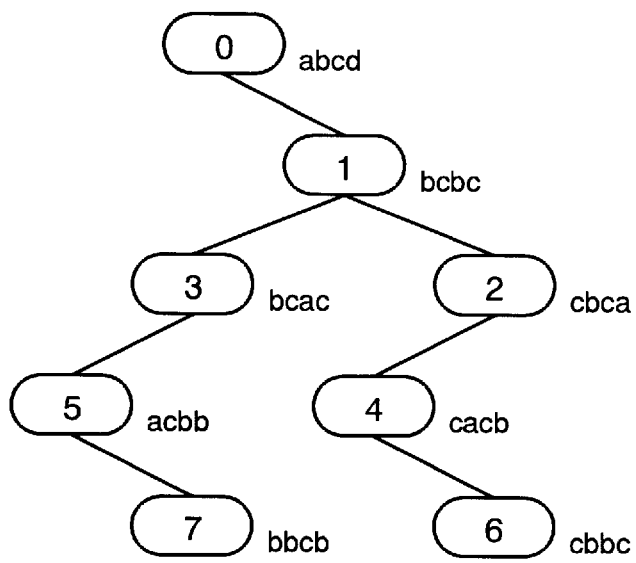
FIG. 8 is an illustration showing an example of construction of a retrieving means employing a binary tree in the condition of the historical data array as illustrated in FIG. 7.
Figure 9:
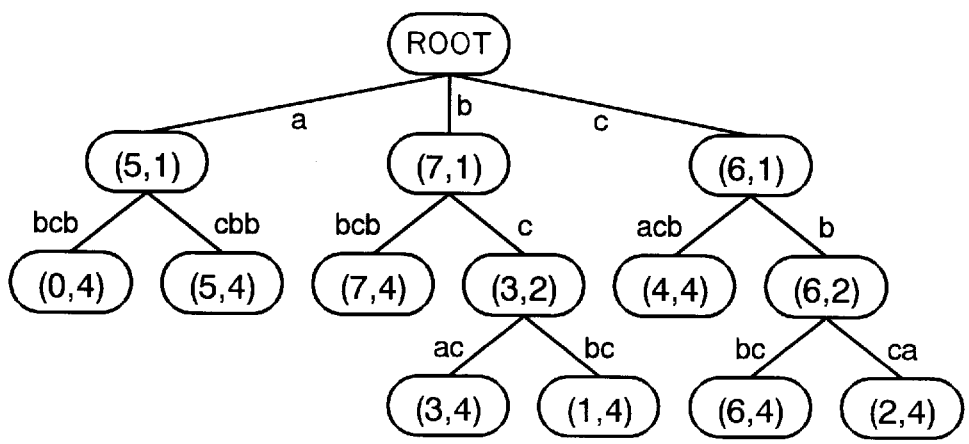
FIG. 9 is an illustration showing an example of construction of a retrieving means employing a trie in the condition of the historical data array as illustrated in FIG. 7.
Figure 10:
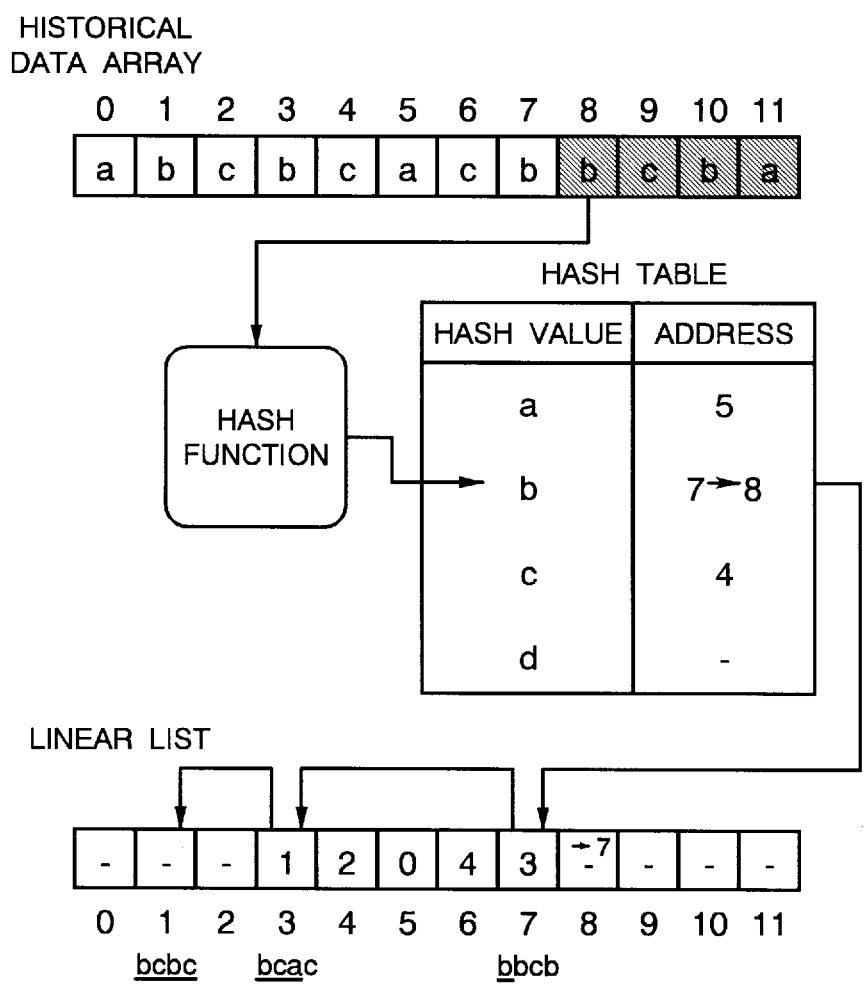
FIG. 10 is an illustration showing an example of construction of a retrieving means employing a hash table with a linear list for collision in the condition of the historical data array as illustrated in FIG. 7.

Experiments were performed. In the conventional data compression system, 28.1% of compression rate was achieved through 175 seconds of execution period. In contrast to this, the first embodiment of the data compression system of the present invention as illustrated in FIG. 3, 29.2% of compression rate is achieved through execution period of 32 seconds. Namely, with lowering of compression rate less than 1%, 6 times higher coding speed can be achieved. On the other hand, in the second embodiment of the data compression system of the invention as illustrated in FIG. 5, when the recording control process is performed by setting the threshold value at 2, 28.7% of compression rate was achieved through execution period of 32 seconds. Namely, with the same compression period to the first embodiment high compression rate dropping merely in the extent of 0.5% in comparison achieved by the conventional data compression system, can be achieved.

On the other hand, in the conventional data compression system, when the same data is compressed with setting the historical data array length N=8192 and the maximum length of the matched character string L=32, 31% of compression rate was achieved through 67 seconds of execution period. Namely, if high speed code is given importance with employing the binary tree as the retrieving means, it is effective to employ the compression system according to the invention rather than modifying the N and L for smaller drop of compression rate.

The compressed data compressed by the data compression system according to the invention as set forth above, is restored into the original condition by a data restoration system corresponding to the data compression system of the invention. The data restoration method and data restoration system corresponding to the present invention will be discussed hereinafter.

The data restoration system includes a historical data array means having a plurality of entries for storing the restored data, an index data array means having entries corresponding to respective entries of the historical data array means, and a duplicating means for duplicating the corresponding character string with respect compression codeword indicative of the position in the historical data array means and the length.

In the construction set forth above, the index data array means maintains index assigned only for the leading position of the character string which is possibly correspond to the compressed data to define the starting point of the character strings to be duplicated from the compression codeword generated from the index in the compressed data.

The character string possibly correspond to the compressed data is only character string beginning from the limited position of the historical data array means. The leading position of the character string is determined on the basis of the length of the restored character string, for example. More specifically, when the leading position of the restored character string and the length of the restored character string are smaller than or equal to a preliminarily determined threshold value, the position is set at the intermediate position of the restored character string. The threshold value may be varied dynamically.

On the other hand, the leading position of the character string possibly correspond to the compressed data may be determined on the basis of the historical data array means at the leading end of the same character string to the restored character string in the historical data array means designated by the compression data. More specifically, when the relative distance between the leading end of the restored character string, the position in the historical data array means at the leading end of the same character string to the restored character string designated by the compression data and the position of the leading end of the restored character string is greater than or equal to the predetermined threshold value, the position is set at the intermediate position of the restored character string.

Also, the leading position of the character string in the historical data array possibly correspond to the compression data can be restricted to the position or the order less than or equal to the threshold value from the leading end of the restored character string.

As set forth above, according to the present invention, even when large historical data array is employed, it becomes possible to reduce number of character strings to be compared and the number of the character strings to be recorded in the retrieving means. Accordingly, without restricting drop of the compression rate, higher speed can be achieved in coding.

In particular, in case of the data having higher redundancy, coding speed can be significantly improved.

Also, when the retrieving means employing the tree structure which requires the same period is required between recording and retrieval, the coding speed can be improved by selectively performing recording.

On the other hand, when the hash table is employed as the retrieving means, number of calculation of the hash function can be reduced by selectively performing recording to the retrieving means. Also, number of character strings in the historical data array to be retrieved and the linear list can be reduced to significantly improve efficiency.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A data compression system comprising:
   historical data array storage means having a plurality of entries for storing input data to be compressed and for storing input data for which coding is completed;
   retrieving and recording means for recording character strings in the input data for which coding is completed selected from the input data from which coding is completed and performing a retrieval of matched character strings through a comparison of character strings in the input data to be compressed and the recorded character strings;
   recording control means for selecting character strings to be recorded in said retrieving and recording means; and
   coding means for performing coding of said matched character strings in the input data to be compressed by using a length of said matched character strings and a position of said matched character strings included in said recorded character strings in said retrieving and recording means,
   wherein said recording control means discriminates between character strings with respect to recording a character string in said retrieving and recording means and not recording a character string in said retrieving and recording means, on the basis of the length of said matched character strings beginning from an intermediate character of said matched character strings.

2. A data compression system as set forth in claim 1, wherein said recording control means records the character strings beginning from the leading end of the matched character strings in the input data and the character strings beginning from an intermediate position of the matched character strings having length smaller than or equal to a predetermined threshold value, in said retrieving and recording means.

3. A data compression system as set forth in claim 2, wherein said threshold value is varied dynamically.

4. A data compression system as set forth in claim 1, wherein said recording control means discriminates each of said character strings beginning from the intermediate characters of said matched character strings in said input data to be compressed between the character strings to be recorded in said retrieving and recording means and the character strings not to be recorded on the basis of the position of the leading end of the matched character string in the coded input data in said historical data array storage means.

5. A data compression system as set forth in claim 1, wherein said recording control means records the character strings beginning from the leading end of the matched character strings in the input data and the character strings beginning from an intermediate positions of the matched character strings which has relative distance between the position of the leading end of said matched character string in the coded input data and position of the leading end of the input data to be compressed being greater than or equal to the threshold value, in said retrieving and recording means.

6. A data compression system as set forth in claim 5, wherein said threshold value is varied dynamically depending upon necessity.

7. A data compression system as set forth in claim 1, which further comprises index data array storage means having entries corresponding to respective entries in said historical data array storage means, said index data array storage means assigning index for the leading entry of the character string to be recorded in said retrieving and recording means among entries of said historical data array storage means, maintaining said index at the position of said index data array storage means corresponding to said entry in said historical data array storage means, and generating a position code indicative of the position of said entry in said historical data array storage means on the basis of said index.

8. A data compression system as set forth in claim 7, wherein said recording control means discriminates each of said character strings beginning from the intermediate characters of said matched character strings in said input data to be compressed between the character strings to be recorded in said retrieving and recording means and the character strings not to be recorded on the basis the length of said matched character string.

9. A data compression system as set forth in claim 7, wherein said recording control means records the character strings beginning from the leading end of the matched character strings in the input data and the character strings beginning from an intermediate position of the matched character strings having length smaller than or equal to the predetermined threshold valve, in said retrieving and recording means.

10. A data compression system as set forth in claim 9, wherein said threshold value is varied dynamically.

11. A data compression system as set forth in claim 7, wherein said recording control means discriminates each of said character strings beginning from the intermediate characters of said matched character strings in said input data to be compressed between the character strings to be recorded in said retrieving and recording means and the character strings not to be recorded on the basis of the position of the leading end of the matched character string in the coded input data in said historical data array storage means.

12. A data compression system as set forth in claim 7, wherein said recording control means records the character strings beginning from the leading end of the matched character strings in the input data and the character strings beginning from an intermediate positions of the matched character strings which has relative distance between the position of the leading end of said matched character string in the coded input data and position of the leading end of the input data to be compressed being greater than or equal to the threshold value, in said retrieving and recording means.

13. A data compression system as set forth in claim 12, wherein said threshold value is varied dynamically.

14. A data compression system comprising:
    historical data array storage means having a plurality of entries for storing input data and for storing coded input data;
    retrieving and recording means for performing retrieval of matched character strings through comparison of the input data to be compressed and the coded input data stored in said historical data array storage means and recording character strings in said historical data array storage means;
    recording control means for selectively recording character strings beginning from positions in a range between the leading end of said matched character strings stored in said historical data array storage means and a given number of positions represented by a threshold value from the leading end of said matched character strings in said retrieving and recording means; and coding means for performing coding of said matched character strings in the input data to be compressed by using the length of said matched character strings and the position of said matched character strings included in said recorded character strings in said retrieving and recording means.

15. A data compression system as set forth in claim 14, which further comprises index data array storage means having entries corresponding to respective entries in said historical data array storage means, said index data array storage means assigning index for the leading entry of the character string to be recorded in said retrieving and recording means among entries of said historical data array storage means, maintaining said index at the position of said index data array storage means corresponding to said entry in said historical data array storage means, and generating a position code indicative of the position of said entry in said historical data array storage means on the basis of said index.

* * * * *